United States Patent
Tanaka et al.

(10) Patent No.: US 8,470,694 B2
(45) Date of Patent: Jun. 25, 2013

(54) APPARATUS AND METHOD FOR GROWING NITRIDE SEMICONDUCTOR CRYSTAL FILM

(75) Inventors: Shinichi Tanaka, Kanagawa-ken (JP);
Tomoaki Kodama, Hadano (JP);
Mutsumi Morita, Kawasaki (JP);
Masayuki Kanechika, Yokohama (JP);
Masayuki Makishima, Yokohama (JP);
Yasuro Kingo, Zama (JP); Toshiyuki Sugawara, Yamagata-ken (JP)

(73) Assignee: Stanley Electric Co., Ltd., Tokyo (JP)

( * ) Notice: Subject to any disclaimer, the term of this patent is extended or adjusted under 35 U.S.C. 154(b) by 14 days.

(21) Appl. No.: 13/024,395

(22) Filed: Feb. 10, 2011

(65) Prior Publication Data

US 2011/0201181 A1 Aug. 18, 2011

(30) Foreign Application Priority Data

Feb. 16, 2010 (JP) ................. 2010-030882

(51) Int. Cl.
*H01L 21/20* (2006.01)
(52) U.S. Cl.
USPC .......................... 438/478; 118/715
(58) Field of Classification Search
USPC ................... 438/478, 483; 118/715, 728
See application file for complete search history.

(56) References Cited

U.S. PATENT DOCUMENTS 5,244,501 A * 9/1993 Nakayama et al. ........... 118/725

FOREIGN PATENT DOCUMENTS

| JP | 2003-173981 | * | 9/2002 |
| JP | 4096678 B2 | | 3/2008 |

* cited by examiner

*Primary Examiner* — Charles Garber
*Assistant Examiner* — Reema Patel
(74) *Attorney, Agent, or Firm* — Holtz, Holtz, Goodman & Chick, P.C.

(57) ABSTRACT

An apparatus for growing a nitride semiconductor crystal film, comprises a chamber that can control inside temperature and air pressure, a susceptor supported by a rotating shaft inside the chamber and on which a growth substrate is placed, a reactant gas supplier that emits reactant gas to the growth substrate in parallel to a surface of the growth substrate, a first subflow gas supplier that emits first subflow gas for pressing the reactant gas down to the surface of the growth substrate at an inclination angle of 45 to 90 degrees in a same in-plane direction as the reactant gas, a second subflow gas supplier that emits second subflow gas for removing the reactant gas from an periphery of the growth substrate to the surface at an inclination angle of 45 to 90 degrees, and an exhaust device that exhausts gas from the chamber.

7 Claims, 5 Drawing Sheets

APPARATUS AND METHOD FOR GROWING NITRIDE SEMICONDUCTOR CRYSTAL FILM

This application is based on Japanese Patent Application 2010-030882, filed on Feb. 16, 2010, the entire contents of which are incorporated herein by reference.

BACKGROUND OF THE INVENTION

A) Field of the Invention

This invention relates to an apparatus and a method for manufacturing a semiconductor device, and more specifically relates to an apparatus and a method for growing a nitride semiconductor crystal film by using a metal organic chemical vapor deposition (MOCVD) method.

B) Description of the Related Art

A metal organic chemical vapor deposition (MOCVD) method is one of chemical vapor deposition methods and used mainly for growing semiconductor crystal.

FIG. 6 is a schematic diagram showing an example of a conventional semiconductor manufacturing apparatus 200.

For example, the semiconductor manufacturing device 200 consists of a reaction chamber 1, a susceptor 2, a substrate heater 3, a reactant gas supplying unit 4, a vacuum (exhaust) pump 5, a substrate rotating unit 7, a subflow gas source 8, a subflow gas controller 50, and a baffle plate (subflow-directing unit) 51.

The reactant gas supplying unit 4 consists of, for example, a reactant gas source, a mass flow controller (MFC), reactant gas nozzle 4p, etc. and supplies reactant gas such as trimethyl gallium (TMG), ammonia gas ($NH_3$), etc. via a reactant gas nozzle 4p placed near the susceptor 2 in the reaction chamber 1. The supplied reactant gas is pyrolysed in the reaction chamber 1 and forms a desired material film on a growth substrate 6 placed on the susceptor 2 supported by a rotating shaft 2s in the reaction chamber 1. The rotating shaft 2s is connected to a substrate rotating unit 7 and rotates in a predetermined direction. Therefore, the growth substrate 6 placed on the susceptor 2 also rotates in the predetermined direction.

The baffle plate (subflow-directing unit) 51 emits subflow gas 52 supplied from the subflow gas source 8 via a subflow gas controller 50 onto an upper surface of the growth substrate 6. The subflow gas source 8 supplies inactive gas such as $H_2$, $N_2$, etc. as the subflow gas which does not include reactant gas, and the subflow gas controller 50 controls an amount of flow of the subflow gas. The baffle plate 51 defines a flowing direction of the subflow gas 52 and has holes functioning as subflow gas emitting nozzles tilted with a predetermined angle (e.g., 90 degrees) to the upper surface of the substrate 6. From those holes the subflow gas 52 is emitted onto the upper surface of the substrate 6 with the determined angle. The subflow gas 52 brings the reactant gas into contact with the upper surface of the substrate 6 for spreading the reactant gas evenly all over the upper surface of the substrate 6 without being diffused in the reaction chamber 1 by thermal convection or the likes.

The reactant gas and the subflow gas 52 are exhausted from the reaction chamber 1 by the vacuum pump 5 via the exhaust port. A cleaning mechanism (not shown in the drawing) for capturing hazardous waste in the exhaust gas is configured before the vacuum pump 5 because the exhaust gas includes massive reaction byproducts and residual substances. Moreover, special equipment for safety disposal (not shown in the drawing) is configured at the end because the exhaust gas tends to include toxic waste such as arsenic or the likes.

FIG. 7 is a graph showing relationships between a distance from an edge of a substrate and a growth rate when nitride semiconductor crystal films are grown by the conventional semiconductor manufacturing apparatus 200. In this graph the distance from one edge of the growth substrate 6 in the unit of [mm] is on the horizontal axis, and the growth rate for one hour in the unit of [µm/hour] is on the vertical axis. A diameter of the growth substrate 6 was 50 mm.

Good growth of semiconductor films could be obtained in a range of 20 mm to 30 mm from the edge, that is, near the center (about 25 mm from the edge) of the growth substrate 6, and growth of semiconductor films which could be used for an LED could be obtained in a range of 10 mm to 40 mm from the edge. However, in a region closer than about 10 mm from the edge and in a region further than about 40 mm from the edge (in a 10 mm wide area from the outer periphery of the growth substrate 6), film thicknesses became too thick comparing to the center and so it could not be used for an LED.

As in the above, in order to prevent the growth rate in the outer periphery of the growth substrate 6 from becoming larger than the growth rate in the center of the growth substrate 6 and to prevent the thickness of the outer periphery from becoming thicker than that in the center, it has been suggested that gas is emitted for removing a part of reactant gas in the outer periphery (see Japanese Patent No. 4096678).

Japanese Patent No. 4096678 (hereinafter patent document 1) discloses a technique using first subflow gas (pressing gas) emitted with an angle of 45 to 90 degrees for bringing reactant gas into contact with a surface of a substrate and second subflow gas (removing gas) for removing the reactant gas in a periphery of the substrate. A nozzle for the second subflow gas is emitted at a right angle or slanted to an emitting direction of the reactant gas in an in-plane direction of the growth substrate and to an opposite direction to a rotating direction of the substrate.

In the conventional technique according to the patent document 1, the nozzle for the second subflow gas is placed in front of the reactor. That is, the nozzle for the second subflow gas and a nozzle for the reactant gas are arranged to make their emitting angles to the surface of the substrate 6 same with each other (placed in parallel to the surface of the substrate); therefore, a large space around the substrate becomes necessary.

Because the nozzle for the second subflow gas is placed in parallel to the surface of the substrate, the second subflow gas spread in a direction in parallel to the surface of the substrate 6 and a component flowing in an opposite way to a flow of the reactant gas may be generated and cause generation of spiral flow which obstructs reproducibility.

Moreover, the first subflow gas and the second subflow gas are emitted to the same place so that the second subflow gas obstructs the flow of the first subflow gas and the effect of the first subflow gas, brining the reactant gas into contact with the substrate, is reduced.

SUMMARY OF THE INVENTION

It is an object of the present invention to provide an apparatus for growing a nitride semiconductor crystal film with conformity in a thickness.

It is another object of the present invention to provide a method for growing a nitride semiconductor crystal film with conformity in a thickness.

According to one aspect of the present invention, there is provided an apparatus for growing a nitride semiconductor crystal film, comprising: a chamber that can control inside temperature and air pressure; a susceptor supported by a rotating shaft inside the chamber and on which a growth substrate is placed; a reactant gas supplier that emits reactant gas to the growth substrate on the susceptor in parallel to a surface of the growth substrate; a first subflow gas supplier that emits first subflow gas for pressing the reactant gas down to the surface of the growth substrate at an inclination angle of 45 to 90 degrees to the surface of the growth substrate in a three-dimensional direction from a position above the growth substrate on the susceptor in a same in-plane direction as an emitting direction of the reactant gas; a second subflow gas supplier that emits second subflow gas for removing the reactant gas from an periphery of the growth substrate to the surface of the growth substrate at an inclination angle of 45 to 90 degrees to the surface of the growth substrate in a three-dimensional direction from a position above the growth substrate on the susceptor; and an exhaust device that exhausts gas from the chamber.

According to another aspect of the present invention, there is provided a method for growing a nitride semiconductor crystal film, comprising the steps of: placing a growth substrate on a susceptor supported by a rotating shaft inside a chamber that can control inside temperature and air pressure; emitting a reactant gas to the growth substrate on the susceptor in parallel to a surface of the growth substrate; emitting first subflow gas for pressing the reactant gas down to the surface of the growth substrate at an inclination angle of 45 to 90 degrees to the surface of the growth substrate in a three-dimensional direction from a position above the growth substrate on the susceptor in a same in-plane direction as an emitting direction of the reactant gas; emitting second subflow gas for removing the reactant gas from an periphery of the growth substrate to the surface of the growth substrate at an inclination angle of 45 to 90 degrees to the surface of the growth substrate in a three-dimensional direction from a position above the growth substrate on the susceptor; and exhausting gas from the chamber.

According to the present invention, an apparatus for growing a nitride semiconductor crystal film with conformity in a thickness can be provided.

Moreover, according to the present invention, a method for growing a nitride semiconductor crystal film with conformity in a thickness can be provided.

DETAILED DESCRIPTION OF THE PREFERRED EMBODIMENTS

Figure 1:
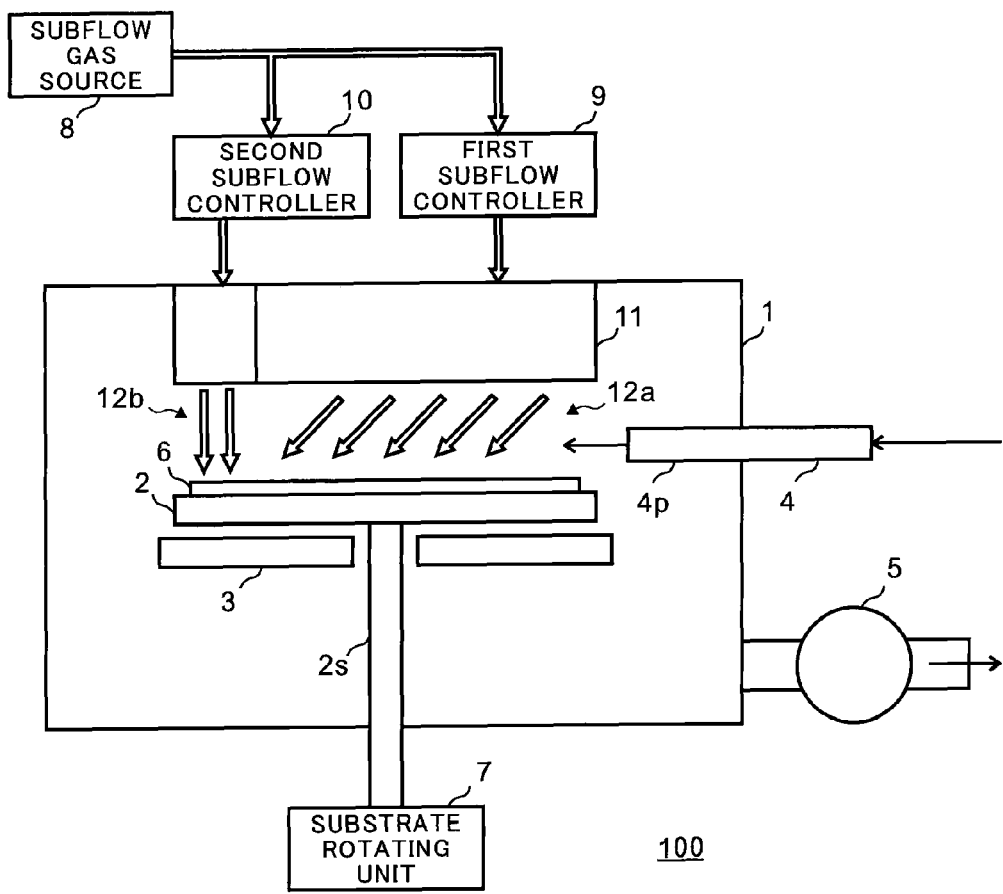
FIG. 1 is a schematic diagram showing a structure of a semiconductor manufacturing apparatus 100 according to embodiments of the present invention.

FIG. 1 is a schematic diagram showing a structure of a semiconductor manufacturing apparatus 100 according to first to third embodiments of the present invention. In each embodiment of the present invention, an apparatus for growing a nitride semiconductor crystal film with a MOCVD method is explained as an example of a semiconductor manufacturing apparatus 100.

For example, the semiconductor manufacturing apparatus 100 consists of a reaction chamber 1, a susceptor 2, a substrate heater 3, a reactant gas supplying unit 4, a vacuum pump 5, a substrate rotating unit 7, a subflow gas source 8, a first subflow controller 9, a second subflow controller 10, and a baffle plate (subflow-directing unit) 11.

The reactant gas supplying unit 4 consists of, for example, a reactant gas source, a mass flow controller (MFC), an automatic valve controller (AVC), a reactant gas nozzle 4p, etc. and supplies reactant gas and carrier gas such as trimethyl gallium (TMG), ammonia gas ($NH_3$), etc. with a flow rate adjusted to a desired amount into the reaction chamber 1. The reactant gas nozzle 4p supplies the reactant gas in a direction almost in parallel to a surface of the susceptor 2 on which the growth substrate 6 is placed.

In the reaction chamber 1 the susceptor 2 supported by a rotating shaft 2s, the baffle plate 11 emitting first and second subflow gasses 12a and 12b, the substrate heater 3 and an exhaust port which exhausts gasses via the vacuum pump 5 are placed. Air pressure inside the reaction chamber 1 can be controlled to a desired level by exhausting with the vacuum pump 5 and to a desired temperature by heating with the substrate heater 3. The susceptor 2 has a surface for horizontally mounting the growth substrate for growing a desired film.

The subflow gas source 8 supplies the subflow gasses to the baffle plate 11 via the first subflow controller 9 and the second subflow controller 10. The subflow gasses consist of inactive gas such as $H_2$, $N_2$, etc. or mixture of the inactive gasses and do not include reactant gas.

The first subflow controller 9 consists of, for example, a mass flow controller (MFC), an automatic valve controller (AVC), etc. and controls a flow rate, etc. of the first subflow gas 12a. The first subflow gas 12a is emitted from subflow gas supplying holes 21 pierced through the baffle plate 11 to an upper surface of the growth substrate 6 at a predetermined angle. The first subflow gas 12a makes the reactant gas evenly spread all over the surface of the growth substrate 6 without being dispersed by thermal convection in the reaction chamber 1 and brings the reactant gas into contact with the surface of the growth substrate 6 by pressing the reactant gas down onto the surface.

The flow rate of the first subflow gas 12a is adjusted to within a range of 5 to 50 SLM, and preferably within a range of 20 to 30 SLM. If the flow rate is not more than 5 SLM, the first subflow gas 12a would not sufficiently press down the reactant gas. If the flow rate is not less than 50 SLM, a time for keeping the reactant gas on the growth substrate 6 will be too short and it leads abnormal growth.

The second subflow controller 10 consists of, for example, a mass flow controller (MFC), an automatic valve controller (AVC), etc. and controls a flow rate, etc. of the second subflow gas 12b. The second subflow gas 12b is emitted from subflow gas supplying holes 22 (FIG. 3A to FIG. 5C) pierced through the baffle plate 11 to an upper surface of a periphery area of the growth substrate 6 at a predetermined angle. The second subflow gas 12b is gas (removing gas) for removing a part or all of the reactant gas for reducing a growth rate in the periphery area of the growth substrate 6 or for making the growth rate conformity with that in a center area of the growth substrate 6.

A function of the second subflow gas 12b is removing a part or all of the reactant gas at the periphery area of the growth substrate 6 without obstructing a function (of pressing the reactant gas down) of the first subflow gas 12a and disturbing a flow of the reactant gas for restraining film thickness and variation in composition with reproducibility. Therefore, in the embodiments of the present invention, the second subflow gas 12b is emitted from a position above the growth substrate as same as the first subflow gas 12a. Moreover, in order not to disturb the flow of the reactant gas, a flow of the second subflow gas 12b has to avoid crossing with a flow of the first subflow gas 12a until the gasses reach the surface of the growth substrate 6. By that, as shown in FIG. 3C, a second subflow gas emission region A, a non-emission region B and a first subflow gas emission region C are formed on the growth substrate 6.

Furthermore, a flow rate of the second subflow gas 12b is adjusted, in consideration of the above-described purpose, to an amount necessary for removing a part or all of the reactant gas at the periphery area of the growth substrate 6 without obstructing a function (of pressing the reactant gas down) of the first subflow gas 12a.

The baffle plate 11 separately emits the first and the second subflow gasses 12a and 12b supplied from the subflow gas source 8 via the first and the second subflow controllers 9 and 10 onto the upper surface of the growth substrate 6. That is, the baffle plate 11 is placed facing to the upper surface of the growth substrate 6. The baffle plate 11 separately emits the first subflow gas 12a and the second subflow gas 12b in the different directions and defines the directions of the flows of the first subflow gas 12a and the second subflow gas 12b so that the subflow gas supplying holes 21 and 22 are pierced with predetermined angles (45 to 90 degrees) to the upper surface of the growth substrate 6. The first subflow gas supplying holes 21 are placed closer to the reactant gas supplying unit 4, and the second subflow gas supplying holes 22 are placed further to the reactant gas supplying unit 4 than the first subflow gas supplying holes 21. The structures of the baffle plate 11 and the subflow gas supplying holes 21 and 22 will be explained later in detail as the first to third embodiments with reference to FIG. 3A to FIG. 5C.

According to the embodiments of the present invention, the first subflow gas 12a and the second subflow gas 12b are emitted from the common baffle plate 11; therefore, a separate baffle plate for the second subflow gas 12b will be unnecessary.

Moreover, a baffle plate for the first subflow gas 12a and a baffle plate for the second subflow gas 12b can be independently prepared. In this case, both baffle plates are placed facing to the growth substrate 6. By doing so, an extra space around the growth substrate 6 in the reactor will not be necessary.

Furthermore, the second subflow gas 12b is emitted from a position above the substrate similar to the first subflow gas 12a; therefore, the second subflow gas 12b will not obstruct the reactant gas pressing function of the first subflow gas 12a. The emission of the first subflow gas 12a and the second subflow gas 12b from the same direction in three-dimensional direction prevent generation of spiral flow generated by emissions from the different directions and so reproducibility can be maintained.

The reactant gas supplied from the reactant gas supplying unit 4 is pyrolysed in the reaction chamber 1 and forms a desired material film on the growth substrate 6 placed on the susceptor 2 supported by the rotating shaft 2s in the reaction chamber 1. The rotating shaft 2s is connected to the substrate rotating unit 7 and rotates in a predetermined direction. Therefore, the growth substrate 6 placed on the susceptor 2 also rotates in the predetermined direction.

Thereafter, the reactant gas and the subflow gasses 12a and 12b are exhausted from the reaction chamber 1 by the vacuum pump 5 via the exhaust port. A cleaning mechanism (not shown in the drawing) for capturing hazardous waste in the exhaust gas is configured before the vacuum pump 5 because the exhaust gas includes massive reaction byproducts and residual substances. Moreover, special equipment for safety disposal (not shown in the drawing) is configured at the end because the exhaust gas tends to include toxic waste such as arsenic or the likes.

Although the first subflow gas 12a and the second subflow gas 12b are supplied from the separate subflow controllers 9 and 10 in the above described embodiment, the first subflow gas 12a and the second subflow gas 12b may be supplied from the same subflow controller. In this case, the baffle plate 11 separates the subflow gas supplied from one subflow controller into the first subflow gas 12a and the second subflow gas 12b. Moreover, in this case, the flow rate of the second subflow gas 12b will be dependent on the flow rate of the first subflow gas 12a which is optimized for realizing an ideal epitaxial growth. With this structure, a separate flow controller for independently controlling the flow rate of the second subflow gas 12b can be omitted and a price for the manufacturing apparatus can be reduced.

Next, an example of a manufacturing process of an LED chip by using the semiconductor manufacturing apparatus 100 according to the embodiments of the present invention will be explained with reference to FIG. 1 and FIG. 2.

Figure 2:
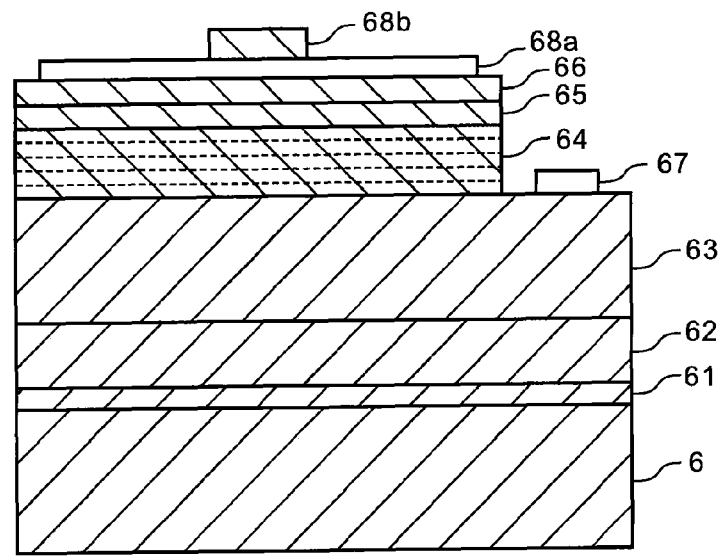
FIG. 2 is a schematic cross sectional view of an LED chip manufactured by using the semiconductor manufacturing apparatus 100 according to the embodiments.

FIG. 2 is a schematic cross sectional view of an LED chip manufactured by using the semiconductor manufacturing apparatus 100 according to the embodiments.

A growth substrate (c-plane sapphire substrate) 6 on which $Al_xIn_yGa_zN$ ($0 \leq x \leq 1$, $0 \leq y \leq 1$, $0 < z \leq 1$, $x+y+z=1$) can be grown by using a MOCVD method is prepared, and a semiconductor film consisting of a lamination of an n-type layer, an active layer and a p-type layer made of $Al_xIn_yGa_zN$ is grown on the growth substrate 6.

For example, first, the sapphire substrate 6 is placed on the susceptor 2 in the reaction chamber 1 and thermal-cleaned by heating at 1000 degrees Celsius in hydrogen atmosphere for 10 minutes.

Next, a low-temperature buffer layer (GaN layer) 61 is formed on the sapphire substrate 6 by supplying trimethyl gallium (TMG) with a flow rate of 10.4 μmol/min and ammonia gas ($NH_3$) with a flow rate of 3.3 LM from the reactant gas supplying unit 4 at about 500 degrees Celsius for three minutes. At this time, the first subflow gas 12a and second subflow gas 12b are emitted respectively from the first subflow gas supplying holes 21 and the second subflow gas supplying holes 22. Thereafter, the first subflow gas 12a and second subflow gas 12b are emitted respectively from the first subflow gas supplying holes 21 and the second subflow gas supplying holes 22 every time when the reactant gas is supplied from the reactant gas supplying unit 4.

Then the formed low-temperature buffer layer 61 is crystallized by raising the temperature to 1000 degrees Celsius, and TMG with a flow rate of 45 μmol/min and NH$_3$ with a flow rate of 4.4 LM are supplied from the reactant gas supplying unit 4 for 20 minutes at the same temperature to form a base GaN layer 62 with a thickness of about fpm on the crystallized low-temperature buffer layer 61.

Next at the temperature of 1000 degrees Celsius, an n-type GaN layer 63 with a thickness of about 2 to 4 μm is formed by supplying TMG with a flow rate of 45 μmol/min, NH$_3$ with a flow rate of 4.4 LM and monosilane (SiH$_4$) with a flow rate of $2.7 \times 10^{-9}$ μmol/min for 40 minutes from the reactant gas supplying unit 4.

For an active layer 64, for example, a multiple quantum well structure consisting of InGaN/GaN can be adopted. In this embodiment, five cycles of InGaN/GaN are grown. An InGaN well layer with a thickness of about 2.2 nm is grown at a temperature of about 700 degrees Celsius by supplying TMG with a flow rate of 3.6 μmol/min, trimethylindium (TMI) with a flow rate of 10 μmol/min and NH$_3$ with a flow rate of 4.4 LM for 33 seconds from the reactant gas supplying unit 4, and a GaN barrier layer with a thickness of about 15 nm is formed by supplying TMG with a flow rate of 3.6 μmol/min and NH$_3$ with a flow rate of 4.4 LM for 320 seconds from the reactant gas supplying unit 4. This process of forming the InGaN well layer and the GaN barrier layer is repeated five times.

Thereafter, the temperature is raised to 870 degrees Celsius, and a p-type AlGaN cladding layer 65 with a thickness of about 40 nm is formed by supplying the TMG with a flow rate of 8.1 μmol/min, trimethylaluminium (TMA) with a flow rate of 7.5 μmol/min, NH$_3$ with a flow rate of 4.4 LM and bis(cyclopentadienyl)magnesium (CP$_2$Mg) with a flow rate of $2.9 \times 10^{-7}$ μmol/min for five minutes from the reactant gas supplying unit 4.

Continuously, a p-type GaN layer 66 with a thickness of about 150 nm is formed at 870 degrees Celsius by supplying TMG with a flow rate of 18 μmol/min, NH$_3$ with a flow rate of 4.4 LM and bis(cyclopentadienyl)magnesium (CP$_2$Mg) with a flow rate of $2.9 \times 10^{-7}$ μmol/min for seven minutes from the reactant gas supplying unit 4.

Then the growth substrate 6 on which the semiconductor layers are laminated is taken out from the reaction chamber 1, and the n-type layer 63 is exposed by performing a Cl$_2$ dry-etching process by using RIE or the likes. Thereafter, a resist mask having an opening at a position where an electrode is formed is formed by a photolithography or the likes, and an n-electrode metal (Ti/Al, etc.) is formed by using an electron beam physical vapor deposition (EB-PVD) or the likes. Then the n-electrode 67 is formed into a desired pattern by a lift-off method. An alloying process by using a rapid thermal annealing (RTA), etc. is performed at 500 degrees Celsius for 20 seconds for improving ohmic contact of the electrode 67. Then a transparent conductive film (ITO, etc.) 68a and a pad electrode (TiAu, etc.) 68b are formed as a p-electrode 68 by using a sputtering method and the EB-PVD. Finally an isolation process is performed to fabricate an LED chip by using laser scribing, dicing or the likes.

Figure 3A:
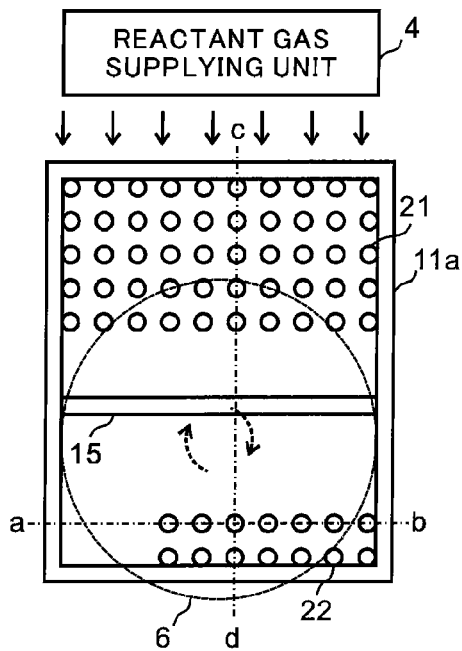
FIG. 3A is a schematic plan view of a baffle plate 11a according to a first embodiment of the present invention.
Figure 3B:
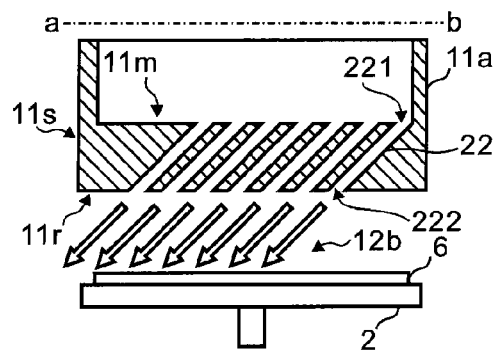
FIG. 3B is a schematic cross sectional view of the baffle plate 11a cut along a line a-b in FIG. 3A.
Figure 3C:
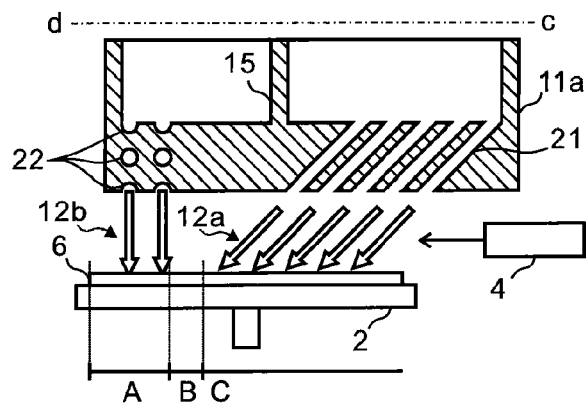
FIG. 3C is a schematic cross sectional view of the baffle plate 11a cut along a line c-d in FIG. 3A.

FIG. 3A is a schematic plan view of a baffle plate 11a according to the first embodiment of the present invention. In the drawing dotted arrows illustrate a rotating direction of the growth substrate 6. FIG. 3B is a schematic cross sectional view of the baffle plate 11a cut along a line a-b in FIG. 3A.

FIG. 3C is a schematic cross sectional view of the baffle plate 11a cut along a line c-d in FIG. 3A.

The baffle plate 11a according to the first embodiment has first subflow gas supplying holes 21 and second subflow gas supplying holes 22. A barrier wall 15 is formed between a region where the first subflow gas supplying holes 21 are formed and a region where the second subflow gas supplying holes 22 are formed in order to partition both regions. If the flow rates of the first subflow gas 12a and the second subflow gas 12b are controlled by one subflow controller, the barrier wall 15 is not necessary.

The first subflow gas supplying holes 21 are pierced through (or formed in) the baffle plate 11 with an inclination angle of 45 degrees in three-dimensional direction to the surface of the growth substrate 6 for supplying the first subflow gas 12a to a region (region C in FIG. 3C) from a position 10 mm from an edge of the growth substrate 6 far from the reactant gas nozzle 4p to a position under the reactant gas nozzle 4p. The inclination angle in three-dimensional direction to the surface of the growth substrate 6 is not limited to 45 degrees but it can be selected from a range of 45 to 90 degrees. Moreover, an inclination direction of the first subflow gas supplying holes 21 in an in-plane direction of the growth substrate 6 (hereinafter the in-plane direction) is adjusted to be the same as a direction of the flow of the reactant gas (a direction illustrated by a solid arrow in the drawing) for not to interfere the flow of the reactant gas.

If a diameter of the first subflow gas supplying holes 21, distribution of the flow rate becomes large this causes generation of a turbulent flow disrupting the flow of the reactant gas. If the diameter is too small, an effect of pressing the reactant gas cannot be obtained even if the flow rate of the subflow gas is increased. Therefore, the diameter of the first subflow gas supplying holes 21 is preferably set to 0.5 to 3 mm and more preferably to 1 to 2 mm. Moreover, a pitch between adjacent first subflow gas supplying holes 21 is preferably set to be in a range from the diameter of the hole to double of the diameter.

In the example shown in FIG. 3A to FIG. 3C, the first subflow gas supplying holes 21 are formed in the baffle plate 11a in a matrix of 10 columns along a short side (a direction perpendicular to the flowing direction of the reactant gas) near the reactant gas supplying unit 4 by 5 lines along a long side (a direction in parallel to the flowing direction of the reactant gas). In this embodiment, a size of the baffle plate 11a is designed to correspond with the growth substrate 6 with a diameter of 50 mm. If the size of the baffle plate 11a and the diameter and the pitch of the first subflow gas supplying holes 21 are changed, number of the first subflow gas supplying holes 21 is changed. Moreover, number of the lines of the first subflow gas supplying holes 21 along the long side (a direction in parallel to the flowing direction of the reactant gas) depends on the inclination angle in three-dimensional direction to the surface of the growth substrate 6 as same as the size, etc. of the baffle plate 11a.

The second subflow gas supplying holes 22 are formed with an inclination angle to emit the second subflow gas 12b to an outer peripheral area of the growth substrate 6 but not to the center of the growth substrate 6. The second subflow gas supplying holes 22 are pierced through (or formed in) the baffle plate 11a with an inclination angle of 45 degrees in three-dimensional direction to the surface of the growth substrate 6 for supplying the second subflow gas 12b to the outer peripheral area of the growth substrate 6 (region A in FIG. 3C) which is an area within 10 mm from the edge of the growth substrate 6 far from the reactant gas nozzle 4p. The inclination angle in three-dimensional direction to the surface of the growth substrate 6 is not limited to 45 degrees but it can be selected from a range of 45 to 90 degrees. Moreover, a three-dimensional direction of the inclination of the second subflow gas supplying holes 22 is adjusted to emit the second subflow gas 12b in a direction along the rotating direction of the growth substrate 6.

Moreover, an inclination of the second subflow gas supplying holes 22 in the in-plane direction is adjusted to be perpendicular to a direction of the flow of the reactant gas (a direction illustrated by a solid arrow in the drawing). The second subflow gas supplying holes 22 are formed to emit the second subflow gas 12b along the rotating direction of the growth substrate 6. Therefore, the rotating direction of the substrate and the flowing direction of the second subflow gas 12b become the same in the in-plane direction, and so disruption of the flow of the reactant gas and generation of spiral flow caused by the disruption can be prevented.

Figure 7:
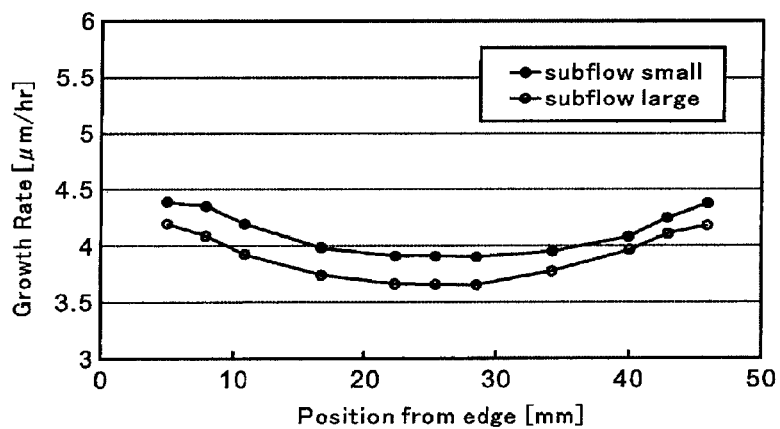
FIG. 7 is a graph showing relationships between a distance from an edge of a substrate and a growth rate when nitride semiconductor crystal films are grown by the conventional semiconductor manufacturing apparatus 200.

The second subflow gas 12b removes the reactant gas supplied to the region A which is an area within 10 mm from an edge or a periphery of the growth substrate 6; therefore, epitaxial growth with conformity in film thickness and composition can be realized. As described with reference to FIG. 7, the growth rate is faster in the area within 10 mm from an edge or a peripheral of the growth substrate 6 than in the center of the substrate (about 25 mm from the edge), and so the faster growth rate in the peripheral area causes a lack of conformity; therefore, the embodiment prevents the faster growth in that part by removing at least a part of the reactant gas at that part to realized the conformity.

The diameter of the second subflow gas supplying holes 22 is preferably set to 0.5 to 3 mm and more preferably to 1 to 2 mm. Moreover, a pitch between adjacent second subflow gas supplying holes 22 is preferably set to be in a range from the diameter of the hole to double of the diameter.

In the example shown in FIG. 3A to FIG. 3C, the second subflow gas supplying holes 22 are formed in the baffle plate 11a in a matrix of 7 columns along a short side (a direction perpendicular to the flowing direction of the reactant gas) far from the reactant gas supplying unit 4 by 2 lines along a long side (a direction in parallel to the flowing direction of the reactant gas).

When viewed from the upper side of the growth substrate 6, the second subflow gas supplying holes 22 are arranged to make a longitudinal direction of the second subflow gas supplying holes 22 almost perpendicular to the flowing direction of the reactant gas (the direction illustrated by the solid arrow in FIG. 3A).

As shown in FIG. 3B, the second subflow gas supplying holes 22 has subflow gas-supply-side openings 221 on a main surface 11m of the baffle plate 11a and growth-substrate-side openings 222 on a reverse side 11r of the baffle plate 11a. The gas-supply-side openings 221 and the growth-substrate-side openings 222 are formed not to open on side surfaces of the baffle plate 11a. Therefore, the gas-supply-side openings 221 of the second subflow gas supplying holes 22 are lined along one of the long sides of the baffle plate 11a to match with the rotating direction of the growth substrate 6. In FIG. 3A, the substrate 6 rotates clockwise (right-handed rotation) so that the gas-supply-side openings 221 are shifted to the right of the baffle plate 11a facing on the reactant gas supplying unit 4.

As described in the above, in this embodiment, a size of the baffle plate 11a is designed to correspond with the growth substrate 6 with a diameter of 50 mm. If the size of the baffle plate 11a and the diameter and the pitch of the first subflow gas supplying holes 22 are changed, number of the second subflow gas supplying holes 22 is changed. Moreover, number of the columns of the second subflow gas supplying holes 22 along the short side (a direction perpendicularly to the flowing direction of the reactant gas) depends on the inclination angle in three-dimensional direction to the surface of the growth substrate 6 as same as the size, etc. of the baffle plate 11a.

Figure 4A:
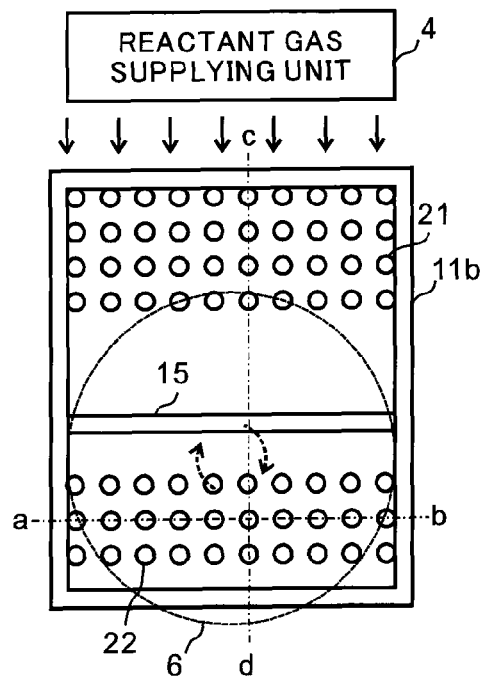
FIG. 4A is a schematic plan view of a baffle plate 11b according to a second embodiment of the present invention.
Figure 4B:
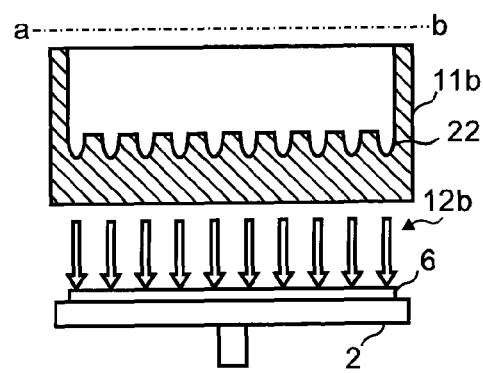
FIG. 4B is a schematic cross sectional view of the baffle plate 11b cut along a line a-b in FIG. 4A.
Figure 4C:
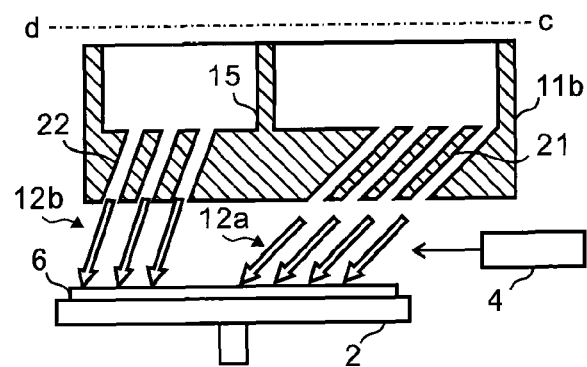
FIG. 4C is a schematic cross sectional view of the baffle plate 11b cut along a line c-d in FIG. 4A.

FIG. 4A is a schematic plan view of a baffle plate 11b according to the second embodiment of the present invention. In the drawing dotted arrows illustrate a rotating direction of the growth substrate 6. FIG. 4B is a schematic cross sectional view of the baffle plate 11b cut along a line a-b in FIG. 4A. FIG. 4C is a schematic cross sectional view of the baffle plate 11b cut along a line c-d in FIG. 4A.

The baffle plate 11b according to the second embodiment, similar to the first embodiment, has first subflow gas supplying holes 21 and second subflow gas supplying holes 22. A barrier wall 15 is formed between a region where the first subflow gas supplying holes 21 are formed and a region where the second subflow gas supplying holes 22 are formed in order to partition both regions. If the flow rates of the first subflow gas 12a and the second subflow gas 12b are controlled by one subflow controller, the barrier wall 15 is not necessary.

Differences between the second embodiment and the first embodiment are the followings. The inclination direction in the in-plane direction of the second subflow gas supplying holes 22 emitting the second subflow gas 12b according to the second embodiment is arranged to be the same as the reactant gas flowing direction (the direction illustrated by the solid arrow in the drawing) similar to the first subflow gas supplying holes 21, and the inclination angle to the surface of the growth substrate 6 in three-dimensional direction of the second subflow gas supplying holes 22 is made to be larger than the inclination angle of the first subflow gas supplying holes 21 and smaller than 90 degrees.

Moreover, in the second embodiment, the second subflow gas supplying holes 22 are formed in the baffle plate 11b in a matrix of 10 columns along a short side (a direction perpendicular to the flowing direction of the reactant gas) far from the reactant gas supplying unit 4 by 3 lines along a long side (a direction in parallel to the flowing direction of the reactant gas). That is, in the second embodiment, one line of the second subflow gas supplying holes 22 are added in consideration of the function of removing a part or all of the reactant gas from the region A (FIG. 3C) which is the area within 10 mm from the edge (peripheral) of the growth substrate 6.

Furthermore, in the second embodiment, number of the lines of the first subflow gas supplying holes 21 is reduced from five to four. The inclination direction in the in-plane direction of the second subflow gas supplying holes 22 according to the second embodiment is set to emit the second subflow gas 12b along the rotating direction of the growth substrate 6 as same as the first embodiment.

Below describes mainly the differences between the baffle plate 11b shown in FIG. 4A to FIG. 4C according to the second embodiment and the baffle plate 11a shown in FIG. 3A to FIG. 3C according to the first embodiment and the explanations of the similar parts are omitted.

In the second embodiment, the flowing directions of the first subflow gas 12a and second subflow gas 12b in the in-plane direction are set to the same directions, and the flowing direction of the second subflow gas 12b in three-dimensional direction is closer to the perpendicular of the growth substrate 6 than the flowing direction of the first subflow gas 12c in three-dimensional direction (i.e., the inclination angle to the surface of the growth substrate 6 in three-dimensional direction of the second subflow gas supplying holes 22 is larger than the inclination angle of the first subflow gas supplying holes 21); therefore, the reactant gas can be removed certainly. Moreover, the inclination angle to the surface of the growth substrate 6 in three-dimensional direction of the second subflow gas supplying holes 22 is designed to be smaller than 90 degrees in order to prevent generation of the reversed flow of the reactant gas and not to disrupt the reactant gas flow.

Figure 5A:
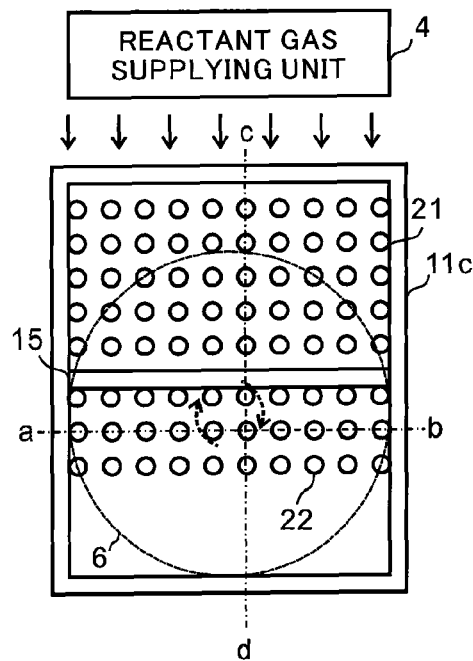
FIG. 5A is a schematic plan view of a baffle plate 11c according to a third embodiment of the present invention.
Figure 5B:
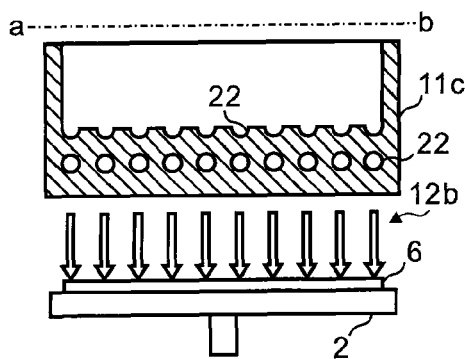
FIG. 5B is a schematic cross sectional view of the baffle plate 11c cut along a line a-b in FIG. 5A.
Figure 5C:
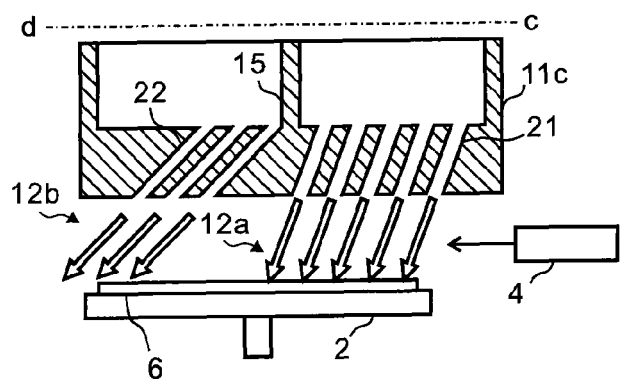
FIG. 5C is a schematic cross sectional view of the baffle plate 11c cut along a line c-d in FIG. 5A.
Figure 6:
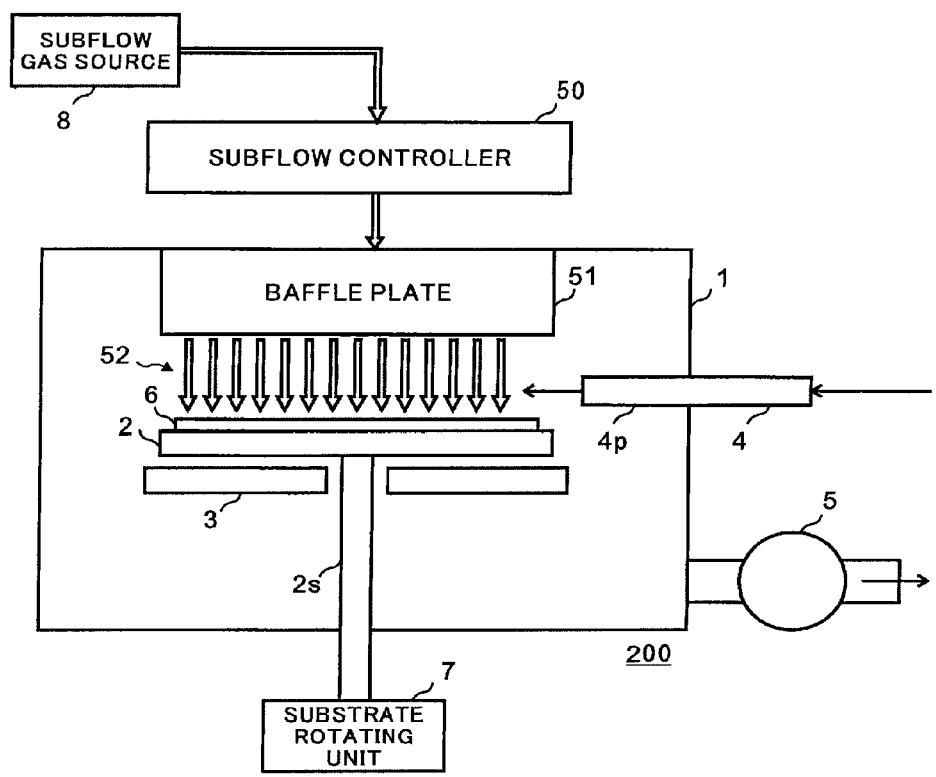
FIG. 6 is a schematic diagram showing an example of a conventional semiconductor manufacturing apparatus 200.

FIG. 5A is a schematic plan view of a baffle plate 11c according to the third embodiment of the present invention. In the drawing dotted arrows illustrate a rotating direction of the growth substrate 6. FIG. 5B is a schematic cross sectional view of the baffle plate 11c cut along a line a-b in FIG. 5A. FIG. 5C is a schematic cross sectional view of the baffle plate 11c cut along a line c-d in FIG. 5A.

The baffle plate 11c according to the third embodiment, similar to the first and the second embodiments, has first subflow gas supplying holes 21 and second subflow gas supplying holes 22. A barrier wall 15 is formed between a region where the first subflow gas supplying holes 21 are formed and a region where the second subflow gas supplying holes 22 are formed in order to partition both regions. If the flow rates of the first subflow gas 12a and the second subflow gas 12b are controlled by one subflow controller, the barrier wall 15 is not necessary.

Below describes mainly the differences between the baffle plate 11c shown in FIG. 5A to FIG. 5C according to the third embodiment and the baffle plates 11a and 11b shown in FIG. 3A to FIG. 4C according to the first and the second embodiments and the explanations of the similar parts are omitted.

Differences between the third embodiment and the first embodiment are the followings. The inclination direction in the in-plane direction of the second subflow gas supplying holes 22 emitting the second subflow gas 12b according to the third embodiment is arranged to be the same as the reactant gas flowing direction (the direction illustrated by the solid arrow in the drawing) similar to the first subflow gas supplying holes 21 as in the second embodiment, and the inclination angle to the surface of the growth substrate 6 in three-dimensional direction of the second subflow gas supplying holes 22 is made to be smaller than the inclination angle of the first subflow gas supplying holes 21 and smaller than 90 degrees. That is, contrary to the second embodiment, the inclination angle to the surface of the growth substrate 6 in three-dimensional direction of the second subflow gas supplying holes 22 is smaller than the inclination angle of the first subflow gas supplying holes 21.

Moreover, in the third embodiment, the second subflow gas supplying holes 22 are formed in the baffle plate 11c in a matrix of 10 columns along the short side by 3 lines along the long side, and their positions are shifted from the opposite side of the reactant gas supplying unit 4 to a region near the first subflow gas supplying holes 21 in consideration of the function of removing a part or all of the reactant gas from the region A (FIG. 3C) which is the area within 10 mm from the edge (peripheral) of the growth substrate 6.

In the third embodiment, the flowing directions of the first subflow gas 12a and second subflow gas 12b in the in-plane direction are set to the same directions, and the flowing direction of the second subflow gas 12b in three-dimensional direction is closer to a plane in parallel to the growth substrate 6 than the flowing direction of the first subflow gas 12c in three-dimensional direction (i.e., the inclination angle to the surface of the growth substrate 6 in three-dimensional direction of the second subflow gas supplying holes 22 is smaller than the inclination angle of the first subflow gas supplying holes 21); therefore, the second subflow gas 12b seldom affects the flow of the first subflow gas 12a and so a growth condition for not to use the second subflow gas 12b can be easily adopted even if the second subflow gas 12b is used.

As described in the above, according to the first to third embodiments of the present invention, the second subflow gas 12b is emitted from a position above the growth substrate similar to the first subflow gas 12a but not from the front the reactor; therefore, there is no need for an extra space around the reactor for a device for emitting the second subflow gas 12b.

Moreover, according to the embodiments of the present invention, the second subflow gas 12b does not flow reversely to the reactant gas flow in the in-plane direction of the growth substrate 6 and so generation of spiral flow can be prevented. Furthermore, the second subflow gas 12b does not flow reversely to the flowing direction of the first subflow gas 12a in the in-plane direction of the growth substrate 6 and so the effect of pressing the reactant gas by the first subflow gas 12a is not reduced.

Therefore, the embodiments of the present invention enable growing a nitride semiconductor crystal film with conformity in composition and in a film thickness.

The present invention has been described in connection with the preferred embodiments. The invention is not limited only to the above embodiments. It is apparent that various modifications, improvements, combinations, and the like can be made by those skilled in the art.

What is claimed is:

1. An apparatus for growing a nitride semiconductor crystal film, comprising:
    a chamber in which an inside temperature and an inside air pressure are controllable;
    a susceptor supported by a rotating shaft inside the chamber and on which a growth substrate is placed;
    a reactant gas supplier that emits reactant gas to the growth substrate on the susceptor in parallel to a surface of the growth substrate;
    a first subflow gas supplier that emits first subflow gas for pressing the reactant gas down to the surface of the growth substrate at an inclination angle of 45 to 90 degrees to the surface of the growth substrate in a three-dimensional direction from a position above the growth substrate on the susceptor in a same in-plane direction as an emitting direction of the reactant gas;
    a second subflow gas supplier that emits second subflow gas for removing the reactant gas from a periphery of the growth substrate, the second subflow gas supplier emitting the second subflow gas to the surface of the growth substrate at an inclination angle of 45 to 90 degrees to the surface of the growth substrate in a three-dimensional direction from a position above the growth substrate on the susceptor, the inclination angle at which the second subflow gas supplier emits the second subflow gas being different from the inclination angle at which the first subflow gas supplier emits the first subflow gas; and
    an exhaust device that exhausts gas from the chamber.

2. The apparatus for growing a nitride semiconductor crystal film according to claim 1, wherein the second subflow gas supplier emits the second subflow gas to a region within 10 mm from an edge of the growth substrate.

3. The apparatus for growing a nitride semiconductor crystal film according to claim 1, wherein the second subflow gas supplier emits the second subflow gas in a same in-plane direction as a rotating direction of the growth substrate.

4. The apparatus for growing a nitride semiconductor crystal film according to claim 1, wherein the second subflow gas supplier emits the second subflow gas in a same in-plane direction as a direction in which the first subflow gas supplier emits the first subflow gas.

5. The apparatus for growing a nitride semiconductor crystal film according to claim 4, wherein the second subflow gas supplier emits the second subflow gas at the inclination angle which is smaller than 90 degrees and larger than the inclination angle at which the first subflow gas supplier emits the first subflow gas.

6. The apparatus for growing a nitride semiconductor crystal film according to claim 4, wherein the second subflow gas supplier emits the second subflow gas at the inclination angle which is smaller than 90 degrees and smaller than the inclination angle at which the first subflow gas supplier emits the first subflow gas.

7. A method for growing a nitride semiconductor crystal film, comprising:
   placing a growth substrate on a susceptor supported by a rotating shaft inside a chamber in which an inside temperature and an inside air pressure is controllable;
   emitting a reactant gas to the growth substrate on the susceptor in parallel to a surface of the growth substrate;
   emitting first subflow gas for pressing the reactant gas down to the surface of the growth substrate at an inclination angle of 45 to 90 degrees to the surface of the growth substrate in a three-dimensional direction from a position above the growth substrate on the susceptor in a same in-plane direction as an emitting direction of the reactant gas;
   emitting second subflow gas for removing the reactant gas from a periphery of the growth substrate, to the surface of the growth substrate at an inclination angle of 45 to 90 degrees to the surface of the growth substrate in a three-dimensional direction from a position above the growth substrate on the susceptor, the inclination angle at which the second subflow gas is emitted being different from the inclination angle at which the first subflow gas is emitted; and
   exhausting gas from the chamber.

\* \* \* \* \*